(12) United States Patent
Chang et al.

(10) Patent No.: US 12,013,792 B2
(45) Date of Patent: Jun. 18, 2024

(54) ERROR AVOIDANCE FOR PARTIALLY PROGRAMMED BLOCKS OF A MEMORY DEVICE

(71) Applicant: Micron Technology, Inc., Boise, ID (US)

(72) Inventors: Li-Te Chang, San Jose, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/842,278

(22) Filed: Jun. 16, 2022

(65) Prior Publication Data

US 2023/0393991 A1 Dec. 7, 2023

Related U.S. Application Data

(60) Provisional application No. 63/348,269, filed on Jun. 2, 2022.

(51) Int. Cl.
| | |
|---|---|
| *G06F 12/10* | (2016.01) |
| *G06F 12/06* | (2006.01) |
| *G06F 12/1027* | (2016.01) |
| *G11C 16/10* | (2006.01) |
| *G11C 16/26* | (2006.01) |
| *G11C 16/34* | (2006.01) |
| *G11C 16/04* | (2006.01) |

(52) U.S. Cl.
CPC ...... *G06F 12/1027* (2013.01); *G06F 12/0692* (2013.01); *G11C 16/10* (2013.01); *G11C 16/26* (2013.01); *G11C 16/349* (2013.01); *G06F 2212/68* (2013.01); *G11C 16/0483* (2013.01)

(58) Field of Classification Search
CPC ............ G06F 12/1027; G06F 12/0692; G06F 2212/68; G11C 16/10; G11C 16/26; G11C 16/349; G11C 16/0483
USPC ........................................................ 711/200
See application file for complete search history.

(56) References Cited

U.S. PATENT DOCUMENTS

| | | | | |
|---|---|---|---|---|
| 9,564,233 | B1* | 2/2017 | Cho ...................... | G11C 16/10 |
| 2019/0004734 | A1* | 1/2019 | Kirshenbaum ....... | G06F 3/0679 |
| 2019/0304550 | A1* | 10/2019 | Shen .................. | G11C 16/3418 |

* cited by examiner

*Primary Examiner* — Hua J Song
(74) *Attorney, Agent, or Firm* — Lowenstein Sandler LLP

(57) ABSTRACT

A read command is received by a processing device coupled to a memory device. The read command specified a logical address. The processing device translates the logical address into a physical address of a physical block of the memory device, wherein the physical address specifies a wordline and a memory device die. Responsive to determining that the physical block is partially programmed, the processing device identifies a threshold voltage offset associated with the wordline. The processing device computes a modified threshold voltage by applying the threshold voltage offset to a read level associated with the memory device die. The processing device reads the data from the physical block using the modified threshold voltage.

20 Claims, 7 Drawing Sheets

Default BFEA Offset Table 504

| Bin | 0 | 1 | 2 | 3 | 4 | 5 | 6 | 7 |
|---|---|---|---|---|---|---|---|---|
| TLC 1 | 0 | 0 | 0 | 2 | 0 | 0 | 4 | 5 |
| TLC 2 | 0 | -1 | -2 | -2 | -3 | -4 | -4 | -5 |
| TLC 3 | 0 | -2 | -4 | -4 | -6 | -8 | -8 | -9 |
| TLC 4 | 0 | -2 | -4 | -6 | -6 | -8 | -11 | -13 |
| TLC 5 | 0 | -3 | -6 | -7 | -9 | -12 | -14 | -17 |
| TLC 6 | 0 | -4 | -8 | -10 | -12 | -16 | -20 | -23 |
| TLC 7 | 0 | -6 | -12 | -15 | -18 | -24 | -30 | -36 |

Additional sub-BFEA Offset Table 506

| Bin | 0 | 1 | 2 | 3 | 4 | 5 | 6 | 7 |
|---|---|---|---|---|---|---|---|---|
| TLC 1 | -14 | -14 | -14 | -14 | -15 | -15 | -15 | -15 |
| TLC 2 | -12 | -12 | -13 | -13 | -14 | -14 | -15 | -15 |
| TLC 3 | -11 | -11 | -11 | -12 | -12 | -13 | -13 | -14 |
| TLC 4 | -13 | -13 | -14 | -14 | -15 | -15 | -16 | -16 |
| TLC 5 | -9 | -10 | -10 | -11 | -12 | -13 | -13 | -14 |
| TLC 6 | -12 | -13 | -13 | -14 | -15 | -16 | -16 | -17 |
| TLC 7 | -9 | -10 | -10 | -11 | -12 | -13 | -14 | -14 |

FIG. 5

ERROR AVOIDANCE FOR PARTIALLY PROGRAMMED BLOCKS OF A MEMORY DEVICE

CLAIM OF PRIORITY

The present application claims the benefit under 35 U.S.C. § 119(e) of U.S. Provisional Patent Application No. 63/348,269 filed Jun. 2, 2022, which is incorporated by reference herein.

TECHNICAL FIELD

Embodiments of the disclosure relate generally to memory sub-systems, and more specifically, relate to error avoidance for partially programmed blocks of a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 5 illustrates example metadata maintained by the memory sub-system controller 115 for applying threshold voltage offsets according to bin and programming level, in accordance with embodiments of the present disclosure.

DETAILED DESCRIPTION

Figure 1:
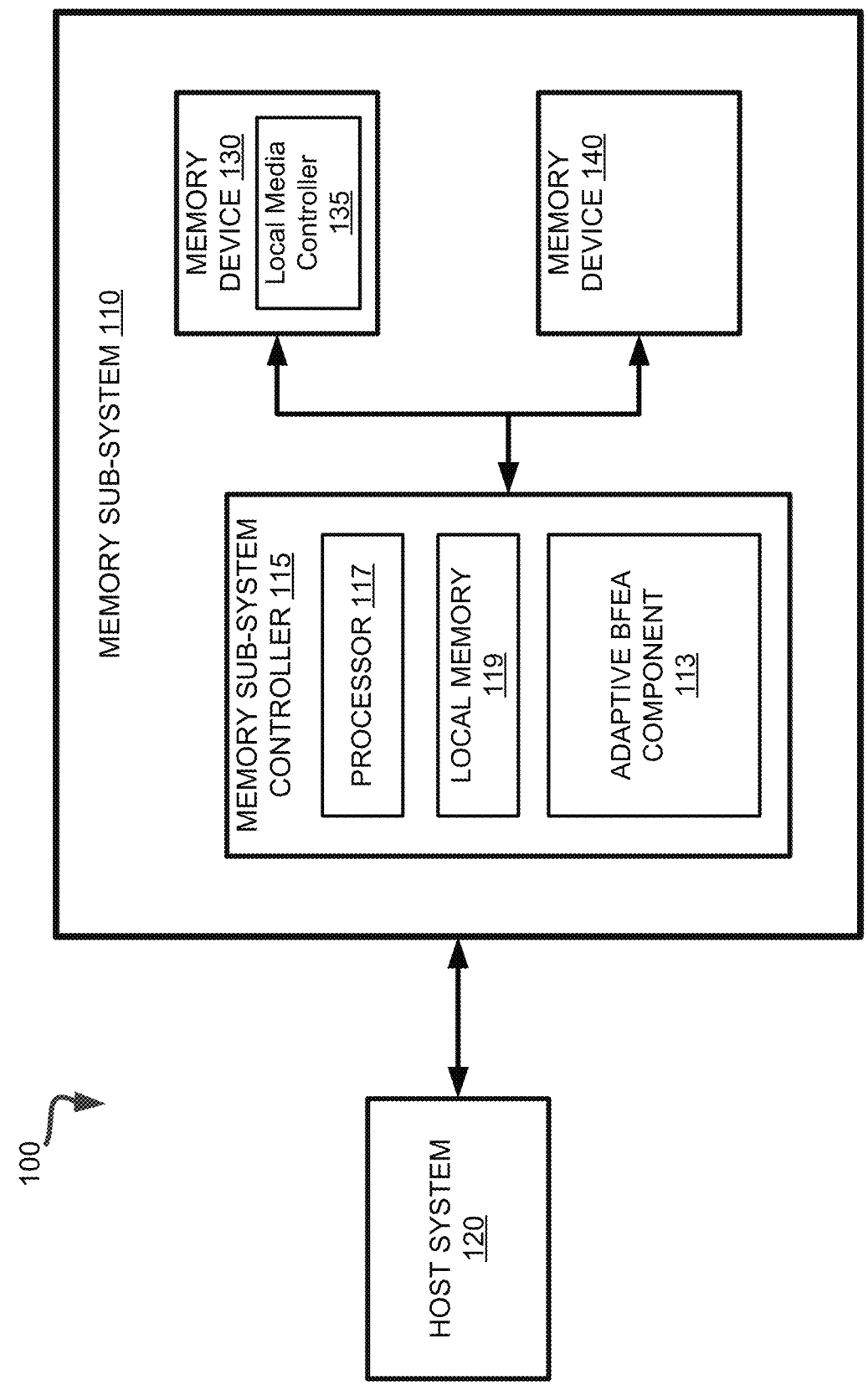
FIG. 1 illustrates an example computing system that includes a memory sub-system in accordance with some embodiments of the present disclosure.

Aspects of the present disclosure are directed to error avoidance for partially programmed blocks of a memory device. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple memory cells arranged in a two-dimensional grid. The memory cells are formed onto a silicon wafer in an array of columns and rows. A memory cell includes a capacitor that holds an electric charge and a transistor that acts as a switch controlling access to the capacitor. Accordingly, the memory cell may be programmed (written to) by applying a certain voltage, which results in an electric charge being held by the capacitor. The memory cells are joined by wordlines, which are conducting lines electrically connected to the control gates of the memory cells, and bitlines, which are conducting lines electrically connected to the drain electrodes of the memory cells.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A programming operation transmits a certain voltage pulse into a wordline. A memory cell connected to the wordline can be programmed (written to) by applying the voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information.

Thus, the read operation can be performed by comparing the measured voltage exhibited by the memory cell to one or more reference voltage levels in order to distinguish between two logical levels for single-level cells and between multiple logical levels for multi-level cells.

"Block" herein shall refer to a set of contiguous or non-contiguous memory pages. A block can be fully or partially programmed. The wordlines in a block can be programmed in sequential order. When every wordline in a block is programmed, the block is fully programmed and can be referred to as a full block. A partially programmed block (or a partial block) refers to a block in which not every wordline has been programmed. The most recently programmed wordline can be referred to as the boundary wordline. The wordlines following the boundary wordline are not programmed; that is, the cells connected to the wordlines following the boundary wordline are in an erase state.

"Read level" herein shall refer to a voltage position. Read levels are numbered in increasing voltage from L1 through $L2^n$, wherein n is the number of bits that can be stored in the cell. As an example, for triple level cells (TLC) corresponding to 3 bits per cell, there can be 8 threshold distributions (levels), and 7 read thresholds (read threshold voltages) can be used to differentiate between the levels. "Read level value" herein shall refer to a voltage or Digital-to-Audio Converter (DAC) value representing a voltage that is applied to the read element (often, the control gate for a NAND cell) for purposes of reading that cell. "Read level offset" herein shall refer to a component of the equation that determines the read level value. Read level offsets can be summed (e.g., read level value=offset_a+offset_b+ . . . ). "Base read level" herein shall refer to the initial threshold voltage level exhibited by the memory cell immediately after programming. In some implementations, base read levels can be stored in the metadata of the memory device. Each read level can correspond to one of the threshold levels described above.

A write operation can store a logical value, e.g., zero or one, in a memory cell by applying a "program" voltage that corresponds to the logical value to a write gate of the cell. A read operation can be performed by applying a read voltage to a control gate of a memory cell and determining whether the read voltage is sufficient to overcome the voltage that was stored at the cell. As an example, in a single-level cell, a first voltage level (e.g., 0 volts) can correspond to a logical one, and a second voltage level (e.g., 3 volts) can correspond to a logical zero. A logical zero can be stored by applying 3 volts to the write gate and a logical one corresponds to the erased distribution, which corresponds to 0 volts in this example. To read the cell, a voltage can be applied to control gate of the cell. If the applied read voltage causes the transistor to conduct, then the voltage stored in the cell is less than the applied voltage. Thus, a voltage between the first and second voltage levels can subsequently be applied to the control gate to determine whether a logical zero or one is stored in the cell. For example, if 1.5 volts are applied to the control gate, and the cell threshold voltage is at 3 volts (logical zero), then the transistor does not conduct (because the applied 1.5 volts does not overcome the written 3 volts), and the stored value can be determined as being a logical zero. Alternatively, if the cell threshold voltage is at 0 volts (logical one), and 1.5 volts are applied to the control gate, the transistor conducts (because the applied 1.5 volts overcomes the written volts), thereby indicating a logical one.

As discussed above, n bits of information can be stored in a memory cell using multiple voltage levels. The read voltage level can be understood as corresponding to the valley between two distributions of voltages, as described below. To store n bits of information, $2^n$ threshold distributions (levels) can be defined. To read $2^n$ threshold distributions, $2^n-1$ read thresholds (read values) can be established. For example, to store 2 bits of information, which can represent four different logical values, the corresponding threshold voltages can be 1 volt, 2 volts, and 3 volts. A particular logical value can be stored in the cell by applying the program voltage level that corresponds to the logical value to a write gate of the cell. Then, to read the two bits of information from the cell, three operations can be performed to identify the voltage that overcomes the voltage that was stored in the cell: apply 0.5 volts on the control gate and read (e.g., by determining whether the transistor conducts), apply 1.5 volts and read, and apply 2.5 volts and read. The results can be used to determine the values of the two logical bits. If applying 0.5 volts causes the transistor to conduct, then 0.5 volts has overcome the written voltage, so the written voltage is 0 volts (e.g., logical zero). Similarly, if applying 1.5 volts causes the transistor to conduct, then the written voltage is 1 volts (e.g., logical one), and the threshold voltage is 1.5 volts. If applying 2.5 volts causes the transistor to conduct, then the written voltage is 2 volts (e.g., logical three). Otherwise, the written voltage is 3 volts (e.g., logical two). When writing, the voltage that is placed on the write gate is inexact and, over a number of memory cells, can be represented as a distribution of voltages around each of the program voltage levels. Thus, in a cell that stores a voltage that can be interpreted as representing two bits, there are four corresponding threshold voltage distributions. Each distribution can be understood as a curve having a peak, representing a highest occurrence rate, at the corresponding program voltage level. Each voltage distribution can have rates that decrease on the left and right sides of the peak. The rates can decrease toward minimum values that approach rates of 0 at voltages (below and above the program voltage level) on the left and right sides of the peak. The voltages of the minimum rates can correspond to the threshold voltages at the boundaries between the voltage distribution and neighboring voltage distributions.

A number of phenomena can affect the threshold voltage of a memory cell. For example, due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

Another phenomena affecting the threshold voltage of a memory cell is cell-to-cell interference, in which programming one memory cell can cause its neighbor cell's threshold voltage to shift. Conversely, when a cell's neighboring cell is not programmed, the threshold voltage of the programmed cell can shift more quickly than the threshold voltage of a cell that has a programmed memory cell on either side. The programmed neighboring memory cells can provide a counter pulse to the inner memory cell, thus slowing the lateral voltage shift.

These threshold voltage shift phenomena can affect partially programmed blocks differently than they affect fully programmed blocks. For example, partially programmed blocks can be less affected by cell-to-cell interference at the time of programming, since not every memory cell has a programmed neighbor cell. However, partially programmed blocks can be more severely affected by lateral voltage shift during the lifecycle of the memory device, as compared to fully programmed blocks, because some cells in partially programmed blocks do not have programmed neighboring memory cells to provide a counter pulse. Some implementations fail to adequately address the differences between how partially programmed blocks and fully programmed blocks are affected by threshold voltage shift. For instance, the page raw bit error rate (RBER) can be one order of magnitude larger for the boundary wordline of a partially programmed block as compared to the same wordline in a fully programmed block. Failure to mitigate the voltage shift affecting partially programmed blocks can result in increased bit error rates, and data degradation.

Some common implementations address partially programmed blocks by implementing auto read calibration (ARC), in which the memory sub-system controller applies additional ARC iterations to calibrate read trim levels and locate the valley center in response to the page RBER exceeding a threshold level. However, implementation additional ARC iterations results in performance penalties due to additional consumption of background bandwidth. Another common implementation pads partially programmed blocks by programming the empty wordlines with dummy data. However, padding blocks with dummy data to fill empty wordlines reduces the space available to a user on a memory device.

Aspects of the present disclosure address the above and other deficiencies by providing a memory sub-system that implements an adaptive block family error avoidance scheme for partially programmed blocks. Block family error avoidance tracks the temporal voltage shift for fully programmed blocks grouped by block families, and applies appropriate voltage offsets to the base read levels in order to perform read operations. The voltage offsets are based on block affiliation with a certain block family. "Block family" herein shall refer to a set of blocks that have been programmed within a specified time window and a specified temperature window.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The temporal voltage shift is selectively tracked for programmed blocks grouped by block families, and appropriate voltage offsets, which are based on block affiliation with a certain block family, are applied to the base read levels in order to perform read operations. Block families can be associated a threshold voltage offset bin, and a block family error avoidance (BFEA) offset table can specify the voltage offsets for each threshold distribution according to block family bin number.

To account for partially programmed blocks in block families, aspects of the present disclosure can add, to the block family threshold offset, an additional read offset to be applied when performing read operations with respect to a partially programmed block. The additional read offsets can be determined using a sub-BFEA offset lookup table, which specifies an additional read voltage offset for each threshold distribution according to voltage offset bin associated with the block family. The memory sub-system controller can identify the appropriate sub-BFEA offset lookup table based on a number of parameters, including the value of a media state metric (e.g., program/erase cycle count) of the memory device on which the block to be read resides, the wordline group of the wordline specified in the read command, whether the wordline is a boundary wordline, and/or the difference between the wordline identifier and the boundary wordline identifier. For example, the threshold voltage shift associated with the boundary wordline of a partially programmed block tends to be more severe than the threshold voltage shift associated with an inner wordline of the partially programmed block. Hence, the sub-BFEA offset table a boundary wordline differs from the sub-BFEA offset table for an inner wordline.

During manufacturing and/or characterization of the memory sub-system, a number of data retention tests can be performed, the results of which indicate the appropriate read offsets for each voltage distribution and block family bin number. The tests can take into account the various parameters listed above, such as the media state metric value (e.g., program/erase cycle count of the memory device), whether the wordline being read is a boundary wordline, the wordline group, and/or the difference between the wordline and the boundary wordline. The test results are then used to generate the multiple sub-BFEA offset tables.

Advantages of the present disclosure include, but are not limited to improved error avoidance for partially programmed blocks, the results of which reduce the value of a data state metric (e.g., page RBER) by one order of magnitude at the time of programming a boundary wordline. A reduction in the value of the data state metric yields an improved trigger margin for the block. With a reduced bit error rate for read operations, the block is less likely to require an error recovery mechanism. The partial block error avoidance scheme described herein reduces the trigger rate of background features, such as read calibration, media scan, and/or read retry. Furthermore, by utilizing and improving upon existing block family error avoidance frameworks, embodiments described herein provide a more robust error avoidance scheme with minimal additional overhead.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes an adaptive BFEA component 113 that can be used to adapt block family-based error avoidance strategies for partially programmed blocks, in accordance with embodiments of the present disclosure. In some embodiments, the memory sub-system controller 115 includes at least a portion of the adaptive BFEA component 113. In some embodiments, the adaptive BFEA component 113 is part of the host system 110, an application, or an operating system. In other embodiments, local media controller 135 includes at least a portion of the adaptive BFEA component 113 and is configured to perform the functionality described herein.

The adaptive BFEA component 113 can implement an error avoidance scheme for partially programmed blocks. The adaptive BFEA component 113 can receive (or otherwise intercept) a read command from host system 120. The read command can be directed to memory device 130. The read command can include a logical address, and the adaptive BFEA component 113 can translate the logical address into a physical address. In embodiments, the adaptive BFEA component 113 can look up the logical address in a logical to physical (L2P) to identify the corresponding physical address. The physical address can include, for example, a memory device identifier (e.g., identifying memory device 130), a die identifier, a block identifier, wordline identifier, and/or a page identifier. The adaptive BFEA component 113 can identify which of a number of threshold voltage offset tables to use to identify the appropriate threshold voltage offset to perform the received read command.

The adaptive BFEA component 113 can identify the appropriate threshold voltage offset table based on a number of parameters, including whether the wordline specified in the physical address is the boundary wordline for the block, the value of a media state metric (e.g., program/erase cycle count) for the block, the wordline group to which the wordline belongs, and/or the difference between the boundary wordline and the wordline specified in the physical address. Further details regarding the threshold voltage offset tables are described with respect to FIG. 5.

The adaptive BFEA component 113 can compute a modified threshold voltage by combining the threshold voltage offset from the identified threshold voltage offset table with the read level voltage for the memory device die. In embodiments, the read level voltage for the memory device die includes a modified threshold voltage that is computed based on a block family threshold voltage offset. A block family can include a group of blocks that have been programmed within a specified time and/or temperature window. The adaptive BFEA component 113 can perform the received read command using the modified threshold voltage, and can return the read data from the physical block to host system 120.

Further details with regards to the operations of the adaptive BFEA component 113 are described below.

Figure 2:
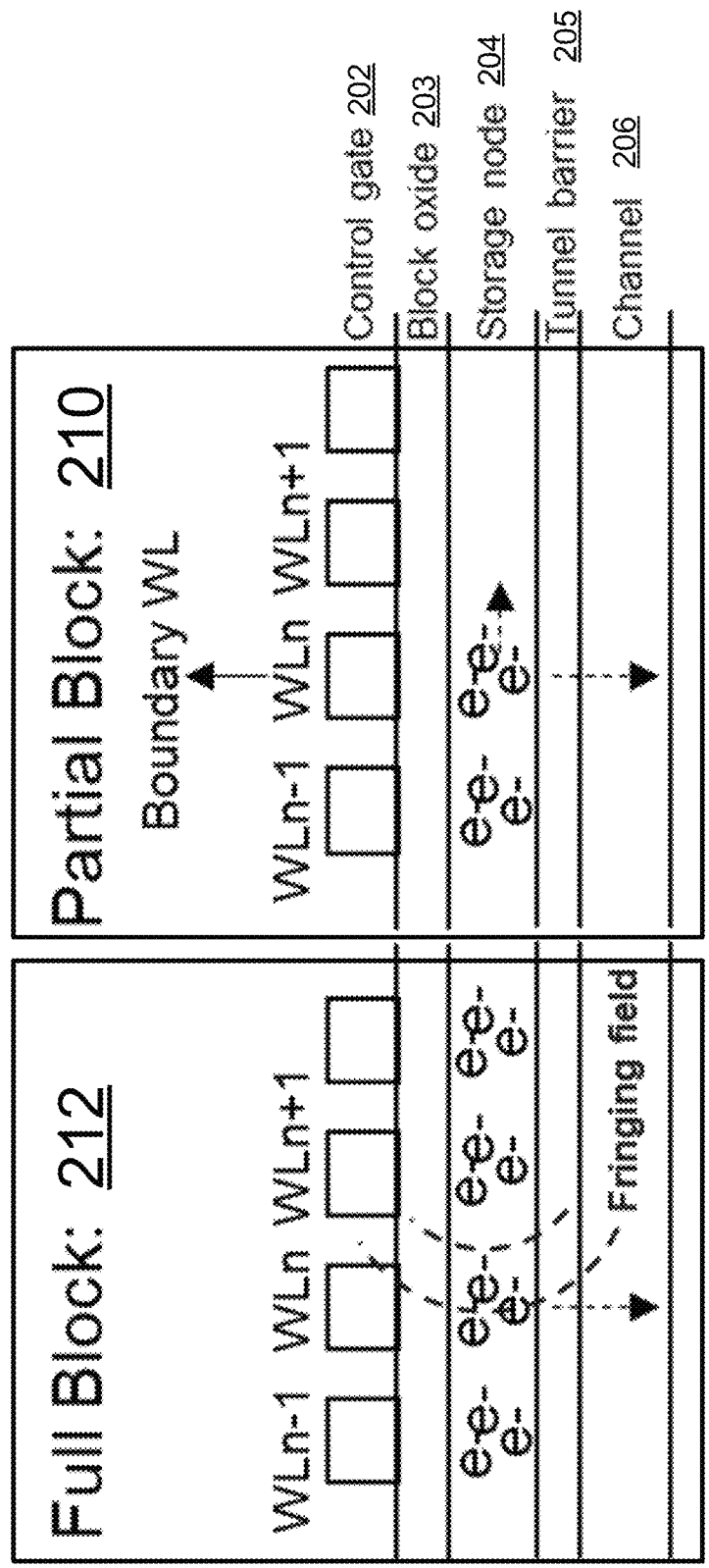
FIG. 2 illustrates a diagram of a cell programming scheme of a block of non-volatile memory, in accordance with some embodiments of the present disclosure.

FIG. 2 illustrates a diagram of a cell programming scheme of a block of non-volatile memory, in accordance with some embodiments of the present disclosure. The block can be contained within memory device 130 of FIG. 1, for example. The embodiment of FIG. 2 illustrates a NAND architecture non-volatile memory. However, embodiments described herein are not limited to this example.

As shown in FIG. 2, a non-volatile memory cell includes a control gate 202, block oxide 203, a storage node 204, tunnel barrier 205, and a channel 206. The control gate 202 of each cell is coupled to a wordline (WL). A programming operation can include applying a number of program pulses (e.g., 16V-20V) to a selected wordline in order to increase the threshold voltage (Vt) of selected cells coupled to that selected wordline to a desired program voltage level.

As shown in FIG. 2, each storage node 204 in full block 212 is charged with electrons. In partial block 210, only the storage nodes 204 connected to wordlines preceding and including the boundary wordline (WLn) are charged with electrons. The storage nodes 204 connected to the wordlines following the boundary wordline (i.e., WLn+1, WLn+2, etc.) are not charged with electrons. That is, the storage nodes 204 connected to the wordlines following the boundary wordline are in an erase state. As illustrated in FIG. 2, the charge from WLn storage node 204 is more susceptible to leak to the neighboring WL (WLn+1), since there are no electrons to provide a counter pulse. Thus, over time, the cells in a partial block 210 are more susceptible to charge loss, causing the Vt of the cells to shift and altering the state of the memory cell. It should be noted that cells coupled to the boundary wordline experience more severe charge loss than those coupled to non-boundary wordlines (also referred to as inner wordlines), and that the severity of the charge loss is directly proportional to the proximity of the wordline to the boundary wordline. That is, WLn-90 will experience a less severe charge loss over time as compared to WLn-45.

Figure 3:
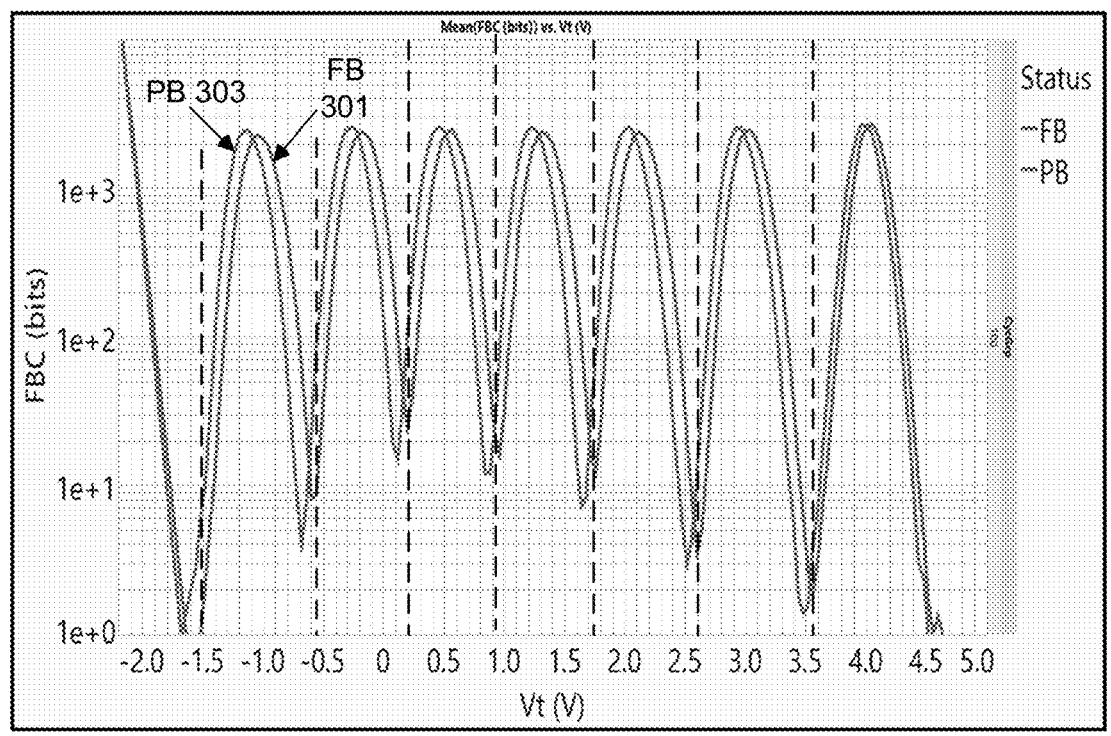
FIG. 3 schematically illustrates the voltage shift on the boundary wordline caused by cell-to-cell interference at time0 exhibited by triple-level memory cells, in accordance with some embodiments of the present disclosure.

FIG. 3 schematically illustrates the voltage shift on the boundary wordline caused by cell-to-cell interference at time0 exhibited by triple-level memory cells, in accordance with some embodiments of the present disclosure. While the illustrative example of FIG. 3 utilizes triple-level cells, the same observations can be made and, accordingly, the same remedial measures are applicable to single level cells and multi-level cells in order to compensate for the voltage shift caused by cell-to-cell interference.

As noted herein above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information.

In FIG. 3, each peak corresponds a voltage distribution produced by memory cells programmed by a respective write level (which can be assumed to be at the midpoint of the distribution) to encode a corresponding logical level ("000" through "111" in case of a TLC). In order to distinguish between neighboring distributions (corresponding to two different logical levels), the threshold voltage levels (shown by dashed vertical lines) are defined, such that any measured voltage that falls below a threshold level is associated with one distribution of the pair of neighboring distributions, while any measured voltage that is greater than or equal to the threshold level is associated with another distribution of the pair of neighboring distributions.

Voltage distributions for a cell coupled to a wordline in a full block are illustrated by FB 301, while the voltage distributions for a cell coupled to a boundary wordline in a partial block are illustrated by PB 303. The voltage distributions FB 301 and PB 303 represent the voltage distributions at time of programming (i.e., a time 0). As described above, the cell coupled to a boundary wordline in a partial block has one charged neighboring cell and one empty neighboring cell. As a results, the cell coupled to the boundary wordline of a partial block experiences a higher voltage shift than the cell of a full block.

Figure 4:
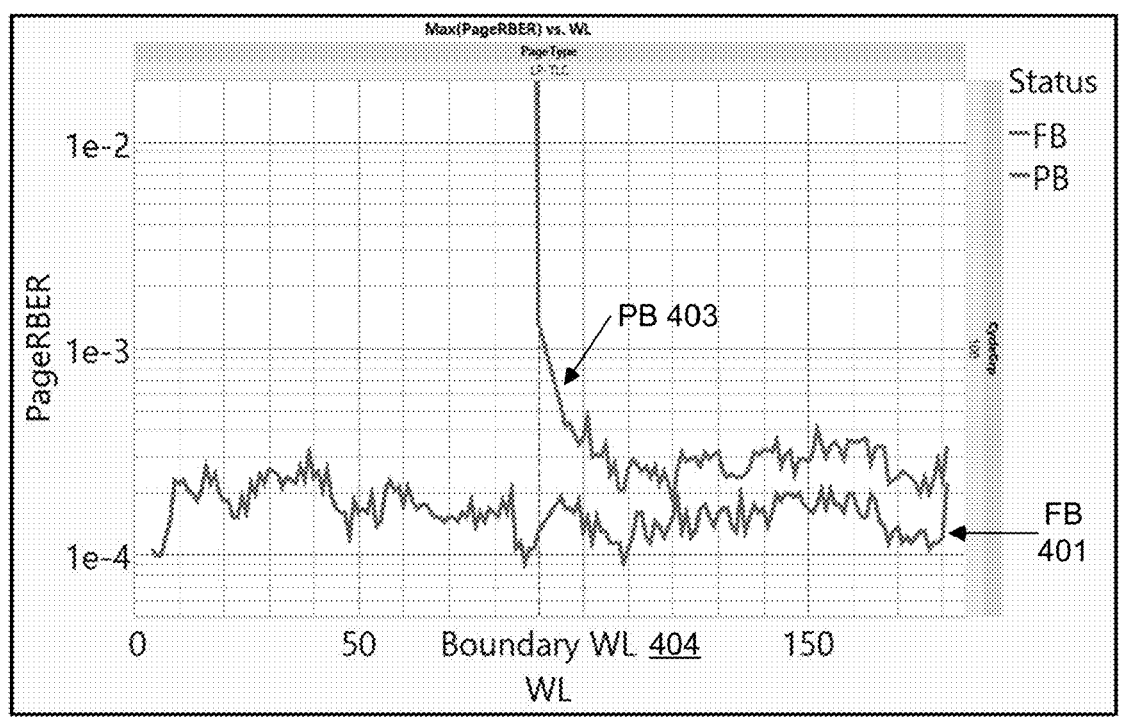
FIG. 4 illustrates page raw bit error rate (RBER) per wordline of a full block compared to a partial block, in accordance with some embodiments of the present disclosure.

FIG. 4 illustrates page raw bit error rate (RBER) per wordline of a full block compared to a partial block, in accordance with some embodiments of the present disclosure. FB 401 illustrates the page RBER per wordline in a fully programmed block, and PB 403 illustrates the page RBER per wordline in a partially programmed block, programmed to the boundary wordline (WL) 404. The page RBER is higher for the PB 403 than compared to the FB 401, and the page RBER is spikes at the boundary wordline for PB 403.

As illustrated by FIGS. 3 and 4, cells in a partial block experience higher voltage shift at time 0 than cells in a full block, and wordlines of a partial block experience higher page RBER than wordlines in a full block. Thus, conventional block family error avoidance techniques that do not take into consideration whether a block is partially or fully programmed can result in higher error rates for partial blocks.

FIG. 5 illustrates example metadata maintained by the memory sub-system controller 115 for applying threshold voltage offsets according to bin and programming level, in accordance with embodiments of the present disclosure. The metadata tables 504, 506 can be stored on one or more memory devices 130 of FIG. 1. In some implementations, at least part of the metadata tables 504, 506 can be cached in the local memory 119 of the memory sub-system controller 115 of FIG. 1.

To implement block family error avoidance, the memory sub-system controller 115 can maintain metadata for associating blocks with block families, and block families with voltage offset bins. For example, the memory sub-system controller can maintain a block family table, which is indexed by the block number. Each record of the block family table specifies, for the block referenced by the index of the record, an identifier of the block family associated with the block (or a portion of the block). The memory sub-system controller 115 can maintain a bin table, indexed by block family number. Each record of the bin table specifies, for the block family referenced by the index of the record, a set of threshold voltage offset bins associated with respective dies of the block family.

The memory sub-system controller 115 can maintain a default BFEA offset table 504, and one or more additional sub-BFEA offset tables 506. Each table 504, 506 lists read offset levels for each bin number (bin 0 through bin 7) and read level (e.g., TLC 1 through TLC 7). That is, each record of the tables 504, 506 specifies a set of threshold voltage offsets associated with respective threshold voltage offset bins.

The memory sub-system controller 115 can maintain multiple additional sub-BFEA offset tables 506, each one associated with one or more parameters. The multiple additional sub-BFEA offset tables 506 can be generated during manufacturing or characterization of the memory sub-system, as a result of performing a number of data retention tests on the memory sub-system. The data retention tests can each be based on a variety of parameters, such as the value of a media state metric (e.g., the number of program/erase cycles performed on the memory device), whether the data is stored in a boundary wordline or an inner wordline, the difference between the boundary wordline and the wordline storing the data, and/or the wordline group of the wordline. For example, different additional sub-BFEA offset tables 506 are used for boundary wordlines than for inner wordlines since the voltage shift and the page RBER may be more severe for data stored in the boundary wordline than for data stored in an inner wordline.

In operation, upon receiving a read command, the adaptive BFEA component 113 determines (e.g., using a logical-to-physical (L2P) mapping table) the physical address corresponding to the logical address (LBA) specified by the read command. The physical address can specify a block number, a die identifier, and a wordline number. The adaptive BFEA component 113 can use the metadata tables to identify the block family associated with the bin associated with the block, and to identify the bin number associated with the block family. Using the bin number and read level, the adaptive BFEA component 113 can identify the default BFEA read offset from the default BFEA offset table 504.

The adaptive BFEA component 113 can then identify the appropriate additional sub-BFEA offset table 506 based on the sub-BFEA parameters, such as the value of a media state metric (e.g., the number of program/erase cycles performed on the memory device), whether the data is stored in a boundary wordline or an inner wordline, the difference between the boundary wordline and the wordline storing the data, and/or the wordline group of the wordline. The adaptive BFEA component 113 can identify the read offset from the identified sub-BFEA table 506 based on the bin number and the threshold distribution (TLC 1 through TLC 7).

The adaptive BFEA component 113 can then additively apply the identified threshold voltage offset to the base voltage read level in order to perform the requested read operation. For example, in order to read from TLC 2 of a block assigned to bin 1, the adaptive BFEA component 113 can identify the read offset from default BFEA offset table 504 for bin 1 at TLC 2 (i.e., "−1"), and the read offset from the additional sub-BFEA offset table 506 for bin 1 at TLC 2 (i.e., "−12"). The adaptive BFEA component 113 can compute a modified read offset by combining these two values (i.e., "−13"), and applying the modified read offset to the base read level for TLC 2. The base read level can be stored in the metadata of the memory device.

Figure 6:
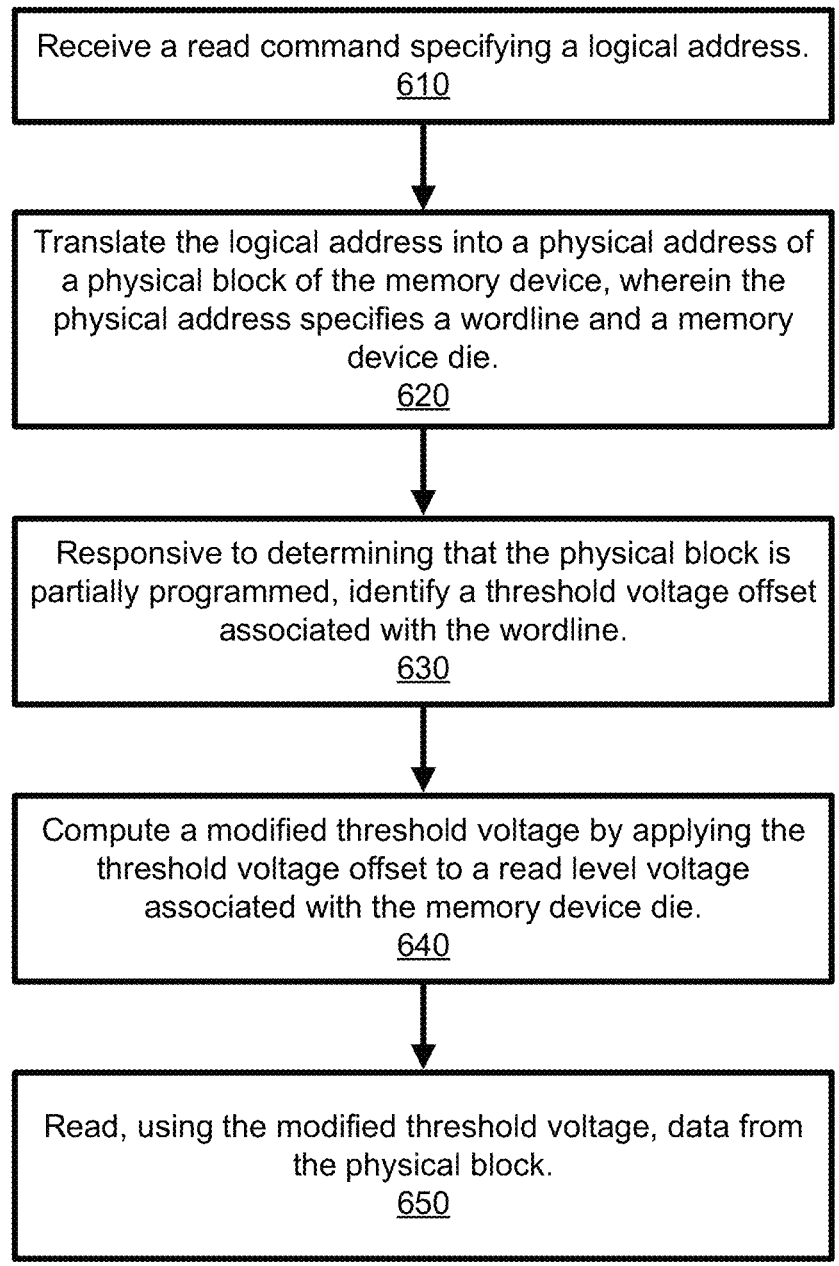
FIG. 6 is a flow diagram of an example method to implement adaptive block family error avoidance for partial block coverage, in accordance with some embodiments of the present disclosure.

FIG. 6 is a flow diagram of an example method 600 to implement adaptive block family error avoidance for partial block coverage, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the adaptive BFEA component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic receives a read command specifying a logical address. The processing logic can receive the read command from a host system, such as host system 120 of FIG. 1.

At operation 620, the processing logic translates the logical address into a physical address of a physical block of the memory device, wherein the physical address specifies a wordline and a memory device die. In an illustrative example, the translation involves looking up the logical block address (LBA) in a logical-to-physical (L2P) table associated with the memory device. The L2P table includes multiple mapping records, such that each mapping record maps an LBA to a corresponding physical address. The physical address can include wordline identifier, die identifier, page identifier, plane identifier, and/or frame identifier. The wordline can be part of a wordline group, which can be a group of N wordlines. In embodiments, wordline groups are based on the default programming voltage that is used to program the cells on those wordlines to a particular programming level.

At operation 630, responsive to determining that the physical block is partially programmed, the processing logic identifies a threshold voltage offset associated with the wordline. To determine that the physical block is partially programmed, the processing logic can identify an indicator (e.g., a full block indicator) that indicates whether the physical block is fully programmed. The full block indicator can be stored in metadata of the physical block. For example, the full block indicator can be a binary flag, with a value of "0" to indicate that the corresponding block is partially programmed, and a value of "1" to indicate that that the corresponding block is fully programmed. In some embodiments, the processing logic can perform a read operation on the block to determine whether the block is fully programmed.

To identify the threshold voltage offset associated with the wordline, the processing logic first determines whether the wordline is a boundary wordline. In embodiments, metadata associated with the physical block can include a boundary wordline indicator. The wordline boundary indicator can specify a wordline number that is the boundary wordline for the block (i.e., the most recently programmed wordline). The processing logic identifies a value of the boundary wordline indicator, and compares the value to the wordline specified in the physical address to determine whether the specified wordline is the boundary wordline.

In embodiments, the processing logic can maintain a number of threshold voltage offset tables, each table corresponding to a wordline group, a media state metric value (e.g., a program/erase cycle count), and/or whether or not the wordline is a boundary wordline. If the wordline is the boundary wordline, the processing logic identifies a first threshold voltage offset table. The first threshold voltage offset table can be a boundary wordline offset table, and can be identified based on the program erase cycle count associated with the physical block, and/or the wordline group of the wordline. If the wordline is not the boundary wordline for the block, the processing logic identifies a second threshold voltage offset set. The second threshold voltage offset table can a non-boundary wordline offset table, and can be identified based on the difference between the wordline number and the boundary wordline, the program erase cycle count of the physical block, and/or the wordline group of the wordline.

The first and second threshold voltage offset tables can include multiple records that each associate threshold voltages to be applied to respective base voltage read levels for performing read operations. An example threshold voltage offset table 506 is described with respect to FIG. 5. The first and second threshold voltage offset tables can be created using testing data collected during characterization of the memory sub-system. The testing data can include the results of a data retention test performed on partially programmed blocks of the memory device.

At operation 640, the processing logic computes a modified threshold voltage by applying the threshold voltage offset to a read level voltage associated with the memory device die. The read level voltage associated with the memory device die includes a block family threshold voltage offset for a block family associated with the physical block. The block family associated with the physical block can include multiple blocks that have been programmed within a specified time and/or temperature window.

At operation 650, the processing logic reads, using the modified threshold voltage, data from the physical block. That is, the processing logic utilizes the computed modified threshold voltage to perform the received read operation. The processing logic can return the read data to the host system (e.g., host system 120 of FIG. 1).

Figure 7:
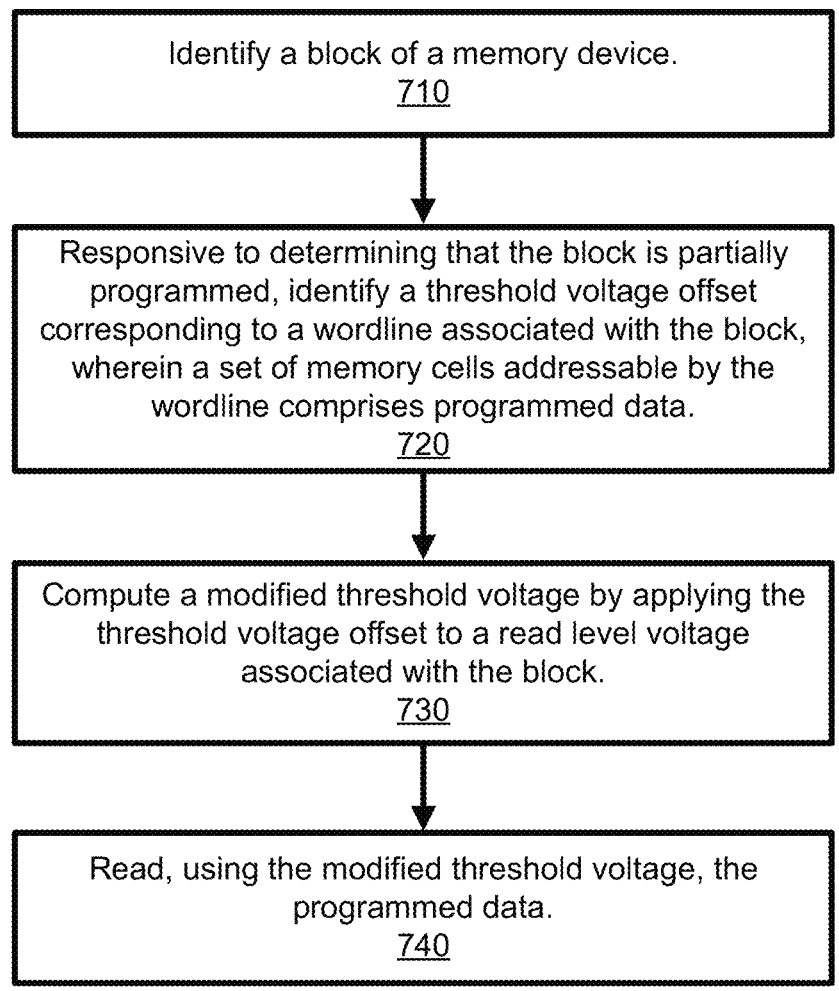
FIG. 7 is a flow diagram of an example method 700 to implement an error avoidance scheme for partially programmed blocks, in accordance with some embodiments of the present disclosure.

FIG. 7 is a flow diagram of an example method 700 to implement an error avoidance scheme for partially programmed blocks, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the adaptive BFEA component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing logic identifies a block of a memory device. The block can be read as part of a media management operation, such as a garbage collection operation.

At operation 720, responsive to determining that the block is partially programmed, the processing logic identifies a threshold voltage offset corresponding to a wordline associated with the block, for which a set of memory cells addressable by the wordline comprises programmed data. That is, the wordline for which the processing logic identifies a threshold voltage offset is not in an erase state.

To determine that the physical block is partially programmed, the processing logic can identify an indicator (e.g., a full block indicator) that indicates whether the physical block is fully programmed. The full block indicator can be stored in metadata of the physical block. For example, the full block indicator can be a binary flag, with a value of "0" to indicate that the corresponding block is partially programmed, and a value of "1" to indicate that that the corresponding block is fully programmed. In some embodiments, the processing logic can perform a read operation on the block to determine whether the block is fully programmed.

To identify the threshold voltage offset associated with the wordline, the processing logic first determines whether the wordline is a boundary wordline. In embodiments, the physical block metadata can include a boundary wordline indicator. The wordline boundary indicator can specify a wordline number that is the boundary wordline for the block (i.e., the most recently programmed wordline). The processing logic identifies a value of the boundary wordline indicator, and compares the value to the wordline specified in the physical address to determine whether the specified wordline is the boundary wordline.

In embodiments, the processing logic can maintain a number of threshold voltage offset tables, each table corresponding to a wordline group, a media state metric value (e.g., a program/erase cycle count), and/or whether or not the wordline is a boundary wordline. If the wordline is the boundary wordline, the processing logic identifies a first threshold voltage offset table. The first threshold voltage offset table can be a boundary wordline offset table, and can be identified based on the program erase cycle count associated with the physical block, and/or the wordline group of the wordline. If the wordline is not the boundary wordline for the block, the processing logic identifies a second threshold voltage offset set. The second threshold voltage offset table can a non-boundary wordline offset table, and can be identified based on the difference between the wordline number and the boundary wordline, the program erase cycle count of the physical block, and/or the wordline group of the wordline.

The first and second threshold voltage offset tables can include multiple records that each associate threshold voltages to be applied to respective base voltage read levels for performing read operations. An example threshold voltage offset table 506 is described with respect to FIG. 5. The first and second threshold voltage offset tables can be created using testing data collected during characterization of the memory sub-system. The testing data can include the results of a data retention test performed on partially programmed blocks of the memory device.

At operation 730, the processing logic computes a modified threshold voltage by applying the threshold voltage offset to a read level voltage associated with the block. The read level voltage associated with the memory device die includes a block family threshold voltage offset for a block family associated with the physical block. The block family associated with the physical block can include multiple blocks that have been programmed within a specified time and/or temperature window.

At operation 740, the processing logic reads, using the modified threshold voltage, the programmed data. That is, the processing logic utilizes the computed modified threshold voltage to perform the received read operation.

Figure 8:
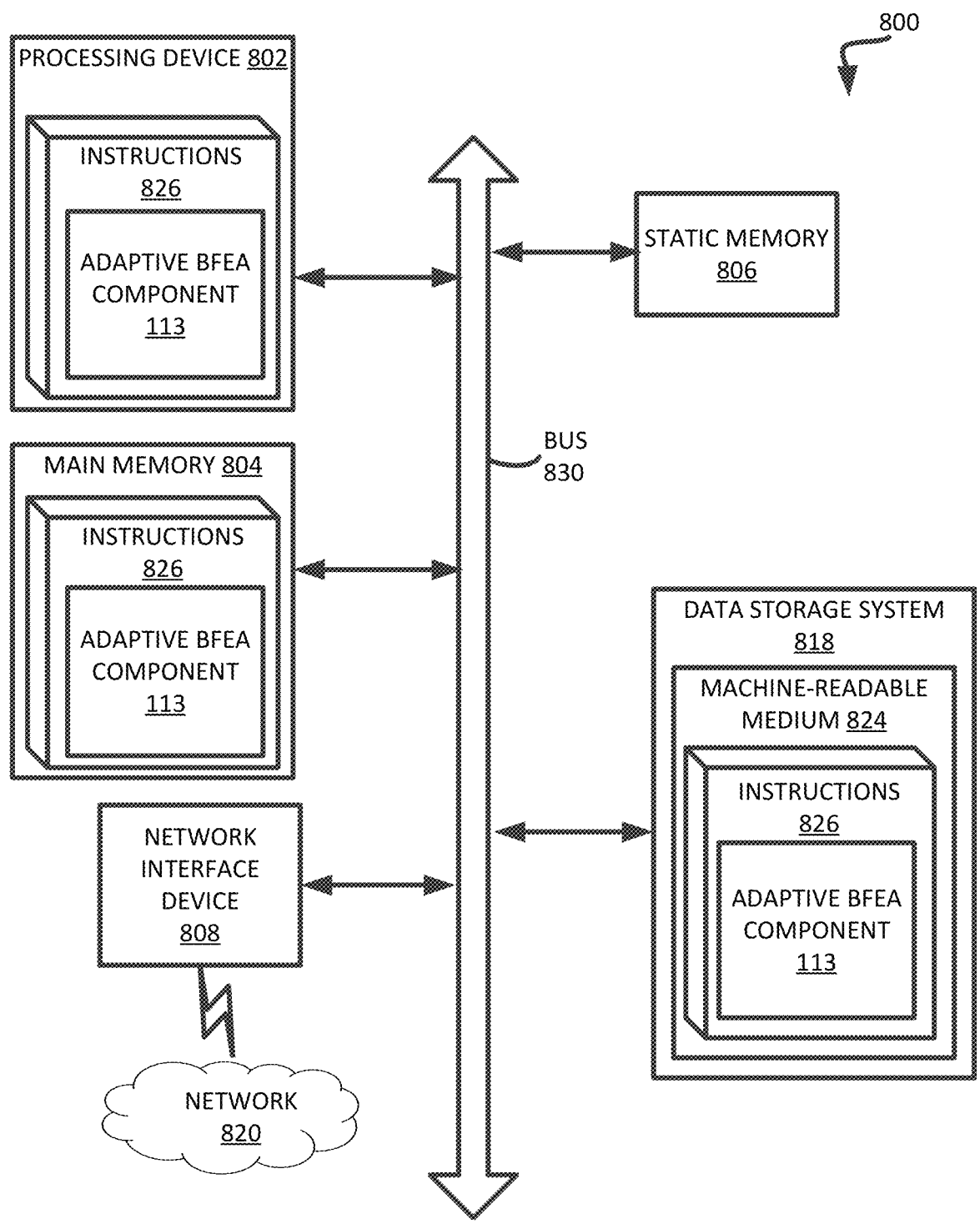
FIG. 8 is a block diagram of an example computer system in which embodiments of the present disclosure may operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the adaptive BFEA component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or RDRAM, etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to an adaptive BFEA component (e.g., the adaptive BFEA component 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, the processing device to:
receive a read command specifying a logical address;
translate the logical address into a physical address of a physical block of the memory device, wherein the physical address specifies a wordline and a memory device die;
identify a threshold voltage offset table based on at least one of: a program erase cycle count associated with the physical block, a wordline group of the wordline, or a difference between the wordline and a boundary wordline of the physical block;
responsive to determining that the physical block is partially programmed, identify, based on the threshold voltage offset table, a threshold voltage offset associated with the wordline;
compute a modified threshold voltage by applying the threshold voltage offset to a read level voltage associated with the memory device die; and
read, using the modified threshold voltage, data from the physical block.

2. The system of claim 1, wherein identifying the threshold voltage offset associated with the wordline comprises:
responsive to determining that the wordline is the boundary wordline, identifying a first threshold voltage offset table based on at least one of: the program erase cycle count associated with the physical block or the wordline group of the wordline; and responsive to determining that the wordline is not the boundary wordline, identifying a second threshold voltage offset table based on at least one of: the difference between the wordline and the boundary wordline, the program erase cycle count associated with the physical block, or the wordline group of the wordline.

3. The system of claim 2, wherein determining that the wordline is the boundary wordline comprises identifying a value of a boundary wordline indicator associated with metadata associated with the physical block.

4. The system of claim 2, wherein the first threshold voltage offset table or the second threshold voltage offset table comprises a plurality of records, and wherein a record of the plurality of records associates one or more threshold voltages to be applied to respective base voltage read levels for performing read operations.

5. The system of claim 2, wherein the first threshold voltage offset table or the second threshold voltage offset table is created using testing data collected during characterization of the system, wherein the testing data comprises a result of a data retention test performed on a partially programmed block of the memory device.

6. The system of claim 1, wherein the read level voltage associated with the memory device die comprises a block family threshold voltage offset for a block family associated with the physical block, wherein the block family associated with the physical block comprises a plurality of blocks that have been programmed within at least one of: a specified time window or a specified temperature window.

7. The system of claim 1, wherein determining that the physical block is partially programmed comprises identifying a full block indicator associated with metadata associated with the physical block, wherein the full block indicator indicates whether the physical block is fully programmed.

8. A method comprising:
identifying, by a processing device, a block of a memory device;
responsive to determining that the block is partially programmed, identifying based on a threshold voltage offset table, a threshold voltage offset corresponding to a wordline associated with the block, wherein a set of memory cells addressable by the wordline comprises programmed data, and wherein the threshold voltage offset table corresponds to at least one of: a program erase cycle count associated with the block, a wordline group of the wordline, or a difference between the wordline and a boundary wordline of the block;
computing a modified threshold voltage by applying the threshold voltage offset to a read level voltage associated with the block; and
reading, using the modified threshold voltage, the programmed data.

9. The method of claim 8, wherein identifying the threshold voltage offset corresponding to the wordline comprises:
responsive to determining that the wordline is the boundary wordline, identifying a first threshold voltage offset table based on at least one of: the program erase cycle count associated with the block or the wordline group of the wordline; and
responsive to determining that the wordline is not the boundary wordline, identifying a second threshold voltage offset table based on at least one of: the difference between the wordline and the boundary wordline, the program erase cycle count associated with the block, or the wordline group of the wordline.

10. The method of claim 9, wherein determining that the wordline is the boundary wordline comprises identifying a value of a boundary wordline indicator associated with metadata associated with the block.

11. The method of claim 9, wherein the first threshold voltage offset table or the second threshold voltage offset table comprises a plurality of records, and wherein a record of the plurality of records associates one or more threshold voltages to be applied to respective base voltage read levels for performing read operations.

12. The method of claim 9, wherein the first threshold voltage offset table or the second threshold voltage offset table is created using testing data collected during characterization of a memory sub-system comprising the memory device, wherein the testing data comprises a result of a data retention test performed on a partially programmed block of the memory device.

13. The method of claim 8, wherein the read level voltage associated with the memory device die comprises a block family threshold voltage offset for a block family associated with the block, wherein the block family associated with the block comprises a plurality of blocks that have been programmed within at least one of: a specified time window or a specified temperature window.

14. A non-transitory computer-readable storage medium comprising instructions that, when executed by a processing device, cause the processing device to perform operations comprising:
receive a read command specifying a logical address;
translate the logical address into a physical address of a physical block of a memory device, wherein the physical address specifies a wordline and a memory device die;
identify a threshold voltage offset table based on at least one of: a program erase cycle count associated with the physical block, a wordline group of the wordline, or a difference between the wordline and a boundary wordline of the physical block;
responsive to determining that the physical block is partially programmed, identify, based on the threshold voltage offset table, a threshold voltage offset associated with the wordline;
compute a modified threshold voltage by applying the threshold voltage offset to a read level voltage associated with the memory device die; and read, using the modified threshold voltage, data from the physical block.

15. The non-transitory computer-readable storage medium of claim 14, wherein identifying the threshold voltage offset associated with the wordline comprises:
responsive to determining that the wordline is the boundary wordline, identifying a first threshold voltage offset table based on at least one of: the program erase cycle count associated with the physical block or the wordline group of the wordline; and
responsive to determining that the wordline is not the boundary wordline, identifying a second threshold voltage offset table based on at least one of: the difference between the wordline and the boundary wordline, the program erase cycle count associated with the physical block, or the wordline group of the wordline.

16. The non-transitory computer-readable storage medium of claim 15, wherein determining that the wordline is the boundary wordline comprises identifying a value of a boundary wordline indicator associated with metadata associated with the physical block.

17. The non-transitory computer-readable storage medium of claim 15, wherein the first threshold voltage offset table or the second threshold voltage offset table comprises a plurality of records, and wherein a record of the plurality of records associates one or more threshold voltages to be applied to respective base voltage read levels for performing read operations.

18. The non-transitory computer-readable storage medium of claim 15, wherein the first threshold voltage offset table or the second threshold voltage offset table is created using testing data collected during characterization of a memory sub-system comprising the memory device, wherein the testing data comprises a result of a data retention test performed on a partially programmed block of the memory device.

19. The non-transitory computer-readable storage medium of claim 14, wherein the read level voltage associated with the memory device die comprises a block family threshold voltage offset for a block family associated with the physical block, wherein the block family associated with the physical block comprises a plurality of blocks that have been programmed within at least one of: a specified time window or a specified temperature window.

20. The non-transitory computer-readable storage medium of claim 14, wherein determining that the physical block is partially programmed comprises identifying a full block indicator associated with metadata associated with the physical block, wherein the full block indicator indicates whether the physical block is fully programmed.

* * * * *